US012476221B2

(12) United States Patent
Sugatani et al.

(10) Patent No.: US 12,476,221 B2
(45) Date of Patent: Nov. 18, 2025

(54) FABRICATION METHOD OF STACKED DEVICE AND STACKED DEVICE

(71) Applicants: ADVANTEST CORPORATION, Tokyo (JP); Tokyo Institute of Technology, Tokyo (JP)

(72) Inventors: Shinji Sugatani, Saitama (JP); Takayuki Ohba, Tokyo (JP)

(73) Assignees: ADVANTEST CORPORATION, Tokyo (JP); TOKYO INSTITUTE OF TECHNOLOGY, Tokyo (JP)

( * ) Notice: Subject to any disclaimer, the term of this patent is extended or adjusted under 35 U.S.C. 154(b) by 722 days.

(21) Appl. No.: 17/838,295

(22) Filed: Jun. 13, 2022

(65) Prior Publication Data
US 2023/0098533 A1    Mar. 30, 2023

(30) Foreign Application Priority Data
Sep. 29, 2021 (JP) .................... 2021-159670

(51) Int. Cl.
H01L 25/065    (2023.01)
H01L 21/768    (2006.01)
H01L 23/48     (2006.01)
H01L 23/60     (2006.01)

(52) U.S. Cl.
CPC .... H01L 25/0652 (2013.01); H01L 21/76898 (2013.01); H01L 23/481 (2013.01); H01L 23/60 (2013.01)

(58) Field of Classification Search
CPC .... H01L 25/0652; H01L 23/481; H01L 23/60
See application file for complete search history.

(56) References Cited

U.S. PATENT DOCUMENTS

| 6,127,694 A | 10/2000 | Nakajima |
| 11,119,146 B1 | 9/2021 | Chong |
| 2007/0228476 A1 | 10/2007 | Okushima |
| 2009/0317975 A1* | 12/2009 | Ding .................. H01L 21/7682 438/700 |
| 2010/0195364 A1 | 8/2010 | Riho |

FOREIGN PATENT DOCUMENTS

| JP | H0611537 A | 1/1994 |
| JP | H1116971 A | 1/1999 |
| JP | 2003332449 A | 11/2003 |
| JP | 2007266450 A | 10/2007 |
| JP | 2012005448 A | 1/2012 |
| JP | 5632584 B2 | 11/2014 |
| WO | 2012011207 A1 | 1/2012 |

OTHER PUBLICATIONS

Office Action issued for counterpart Japanese Application No. 2021-159670, transmitted from the Japanese Patent Office on Apr. 15, 2025 (drafted on Apr. 3, 2025).

* cited by examiner

Primary Examiner — Peniel M Gumedzoe

(57) ABSTRACT

Provided is a stacked device comprising: a plurality of circuit layers each having a circuit portion; an insulating layer configured to cover a plurality of circuit portions included in a part of circuit layers of the plurality of circuit layers, and a plurality of conductive vias provided in the insulating layer and electrically connected to the plurality of circuit portions, wherein the conductive via electrically connected to a partial circuit portion of the plurality of circuit portions is electrically insulated on an end surface on an opposite side to the plurality of circuit portions and the partial circuit portion is broken at least partially along a stacking direction.

4 Claims, 18 Drawing Sheets

FABRICATION METHOD OF STACKED DEVICE AND STACKED DEVICE

The contents of the following Japanese patent application are incorporated herein by reference:
2021-159670 filed in JP on Sep. 29, 2021

BACKGROUND

1. Technical Field

The present invention relates to a fabrication method of a stacked device, and a stacked device.

2. Related Art

Patent Documents 1 to 4 disclose "in the forming process of the electrode pad 200, . . . at least a part of a surface of the electrode pad 200 that is connected to a bonding wire 400 (which will be described later) is caused to protrude from the protection insulating film 300, thereby forming a protrusion 201. . . . After an operation test process of the semiconductor element, a polishing process of the electrode pad 200 is performed . . . ."

PRIOR ART DOCUMENT

Patent Document

[Patent Document 1] Japanese Patent Application Publication No. 2012-5448
[Patent Document 2] International Publication No. WO2012/11207
[Patent Document 3] Japanese Patent Application Publication No. H11-16971
[Patent Document 4] Japanese Patent No. 5,632,584

DESCRIPTION OF EXEMPLARY EMBODIMENTS

Hereinafter, the present invention will be described through embodiments of the invention, but the following embodiments do not limit the invention according to the claims. In addition, not all combinations of features described in the embodiments are essential to the solution of the invention.

1. First Embodiment

[1.1 Stacked Device 1]

Figure 1:
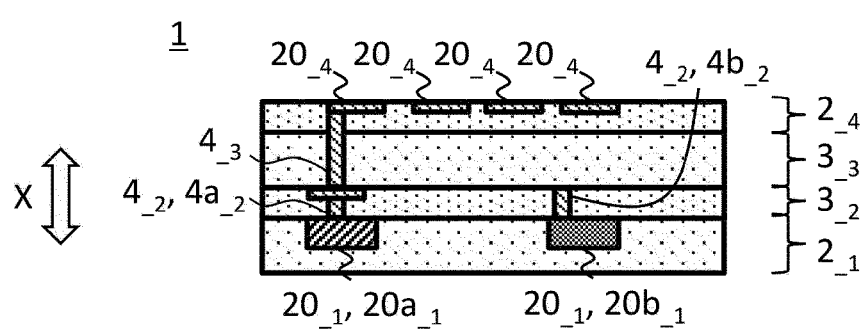
FIG. 1 shows a stacked device 1 according to a first embodiment.

FIG. 1 shows a stacked device 1 according to the present embodiment. The stacked device 1 includes a plurality of circuit layers 2 (two circuit layers $2_{\_1}$ and $2_{\_4}$, as an example, in the present embodiment), a plurality of insulating layers 3 (two insulating layers $3_{\_2}$ and $3_{\_3}$, as an example, in the present embodiment), and a plurality of conductive vias 4. Note that, FIG. 1 shows a cross section of the stacked device 1 with a stacking direction X of the stacked device 1 as a vertical direction in the drawing. The stacked device 1 may have the circuit layer $2_{\_1}$, the insulating layer $3_{\_2}$, the insulating layer $3_{\_3}$ and the circuit layer $2_{\_4}$ in order from the lower layer-side.

[1.1-1. Circuit Layer 2]

Each circuit layer 2 has one or more circuit portions 20. Each circuit portion 20 may be a portion constituting a part of a circuit or may be a portion that can form a part of the circuit by being electrically connected. Each circuit portion 20 may include a conductive path, may include a passive element such as a resistor, a coil and a capacitor, and may include an active element such as a transistor and a diode.

In the present embodiment, as an example, the circuit layer $2_{\_1}$ has a plurality of circuit portions $20_{\_1}$, and the circuit layer $2_{\_4}$ has a plurality of circuit portions $20_{\_4}$. Each circuit portion $20_{\_4}$ provided in the circuit layer $2_{\_4}$ may constitute a circuit of the stacked device 1.

A partial circuit portion $20_{\_1}$ (also referred to as circuit portion $20a_{\_1}$) of the plurality of circuit portions $20_{\_1}$ provided in the circuit layer $2_{\_1}$ may be an example of the first circuit portion, and may constitute the circuit of the stacked device 1. In addition, another circuit portion $20_{\_1}$ (also referred to as circuit portion $20b_{\_1}$), which is different from the circuit portion $20a_{\_1}$, of the plurality of circuit portions $20_{\_1}$ may be an example of the second circuit portion, and may not constitute the circuit of the stacked device 1. The circuit portion $20b_{\_1}$ may not be electrically connected to the circuit portion $20a_{\_1}$ in the circuit layer $2_{\_1}$. The circuit portion $20b_{\_1}$ may be a portion used in a test of the circuit portion $20a_{\_1}$ during fabrication of the stacked device 1.

For example, the circuit portion $20b_{\_1}$ may have at least one of an ESD protection circuit, a BIST circuit, a process monitor circuit, or a switching circuit. The ESD protection circuit may be a circuit configured to protect the circuit portion $20a_{\_1}$ from an electrostatic discharge that occurs in a test during the fabrication by being temporarily connected to the circuit portion $20a_{\_1}$ on the circuit layer $2_{\_1}$ during the fabrication of the stacked device 1.

The BIST circuit may be a circuit configured to perform a test of the circuit portion $20a_{\_1}$ by being temporarily connected to the circuit portion $20a_{\_1}$ on the circuit layer $2_{\_1}$ during the fabrication of the stacked device 1. For example, the BIST circuit may be configured to test operations of the one or more circuit portions $20_{\_1}$ and may be configured to test conduction, disconnection, defect in a characteristic, a capacity and the like of each circuit portion $20_{\_1}$.

The process monitor circuit may be a circuit configured to monitor a physical characteristic of the circuit portion $20a_{\_1}$ by being temporarily connected to the circuit portion $20a_{\_1}$ on the circuit layer $2_{\_1}$ during the fabrication of the stacked device 1, and may be configured to monitor conduction, disconnection, defect in a characteristic, a capacity and the like of the circuit portion 20a$_{\_1}$, for example. The process monitor circuit may have a transistor, a resistor, a ring transmitter, and the like.

The switching circuit may be a switching circuit configured to switch connection among the plurality of circuit portions 20a$_{\_1}$ by being temporarily connected to the circuit portion 20a$_{\_1}$ on the circuit layer 2$_{\_1}$ during the fabrication of the stacked device 1. For example, the switching circuit may be an I/O selector.

[1.1-2. Insulating Layer 3]

Each insulating layer 3 is formed of an insulating material such as silicon oxide (SiO$_2$) or silicon carbide (SiOC). Each insulating layer 3 may be provided adjacent to the circuit layer 2 in the stacking direction X. In the present embodiment, as an example, the insulating layer 3$_{\_3}$ is provided adjacent to a lower surface of the circuit layer 2$_{\_4}$, and the insulating layer 3$_{\_2}$ is provided adjacent to an upper surface of the circuit layer 2$_{\_1}$. The insulating layer 3$_{\_2}$ may be configured to cover the plurality of circuit portions 20 included in a part of circuit layers 2 of the plurality of circuit layers 2 (in the present embodiment, as an example, the circuit portion 20$_{\_1}$ included in the circuit layer 2$_{\_1}$).

[1.1-3. Conductive Via 4]

Each conductive via 4 is formed of a conductive material such as tungsten, copper or aluminum. Each conductive via 4 may be provided in the insulating layer 3 and electrically connected to any circuit portion 20.

One or more conductive vias 4 (also referred to as conductive vias 4$_{\_3}$), which are provided in the insulating layer 3$_{\_3}$, of the plurality of conductive vias 4 may be electrically connected to the one or more circuit portions 20$_{\_4}$ included in the circuit layer 2$_{\_4}$.

A plurality of conductive vias 4 (also referred to as conductive vias 4$_{\_2}$), which are provided in the insulating layer 3$_{\_2}$, of the plurality of conductive vias 4 may be electrically connected to the plurality of circuit portions 20$_{\_1}$ included in the circuit layer 2$_{\_1}$. A conductive via 4$_{\_2}$ (also referred to as conductive via 4a$_{\_2}$), which is electrically connected to the circuit portion 20a$_{\_1}$, of the plurality of conductive vias 4$_{\_2}$ may be electrically connected to the conductive via 4$_{\_3}$. Thereby, any circuit portion 20$_{\_1}$ of the circuit layer 2$_{\_1}$ and any circuit portion 20$_{\_4}$ of the circuit layer 2$_{\_4}$ are electrically connected to each other.

In addition, a conductive via 4$_{\_2}$ (also referred to as conductive via 4b$_{\_2}$), which is electrically connected to the circuit portion 20b$_{\_1}$, of the plurality of conductive vias 4$_{\_2}$ may be electrically insulated on an end surface on an opposite side to the circuit portion 20$_{\_1}$ (an end surface on the insulating layer 3$_{\_3}$-side, in the present embodiment). In the present embodiment, as an example, the end surface of the conductive via 4b$_{\_2}$ may be covered by the insulating layer 3$_{\_3}$.

Thereby, the circuit portion 20b$_{\_1}$ may be in a state of being embedded in the stacked device 1 and being electrically separated from the other circuit portions 20. However, in a case where the circuit layer 2$_{\_4}$ and the insulating layer 3$_{\_3}$ are removed from the stacked device 1, and a conductive path which is electrically connected to the plurality of circuit portions 20$_{\_1}$ via each of the plurality of conductive vias 4$_{\_2}$ is formed, the circuit portion 20b$_{\_1}$ may be able to be used for a test of the circuit portion 20a$_{\_1}$.

According to the stacked device 1 described above, the plurality of conductive vias 4$_{\_2}$ are provided in the insulating layer 3$_{\_2}$ and are electrically connected to the plurality of circuit portions 20$_{\_1}$. Therefore, in a fabricating step of the stacked device 1, a test can be performed on at least a part of circuit portions (the circuit portion 20a$_{\_1}$, as an example, in the present embodiment) of the plurality of circuit portions 20$_{\_1}$ via the conductive vias 4$_{\_2}$. Therefore, a quality of the stacked device 1 can be reliably improved by fabricating the stacked device 1 while determining the quality of the stacked device 1 during the fabrication.

In addition, since the conductive via 4b$_{\_2}$ electrically connected to the part of circuit portions 20b$_{\_1}$ of the plurality of circuit portions 20$_{\_1}$ is electrically insulated on the end surface on the side opposite to the circuit portions 20$_{\_1}$, the part of circuit portions 20b$_{\_1}$ is prevented from being connected to the other circuit portions 20 via the conductive via 4$_{\_2}$ and becoming an unnecessary capacitive component in the stacked device 1. Therefore, the quality of the stacked device 1 can be improved more reliably.

Further, since the circuit portion 20b$_{\_1}$ included in the circuit layer 2$_{\_1}$ has the ESD protection circuit, it is possible to perform a test of the circuit portion 20a$_{\_1}$ while protecting the circuit portion 20a$_{\_1}$ from the electrostatic discharge during the fabrication of the stacked device 1. Further, since the circuit portion 20b$_{\_1}$ has the BIST circuit, it is possible to test the circuit portion 20a$_{\_1}$ by the circuit portion 20b$_{\_1}$ during the fabrication of the stacked device 1. Further, since the circuit portion 20b$_{\_1}$ has the process monitor circuit, it is possible to perform a test of a physical characteristic of the circuit portion 20a$_{\_1}$ during the fabrication of the stacked device 1. Further, since the circuit portion 20b$_{\_1}$ has the switching circuit, it is possible to perform the test while switching connection with the circuit portion 20a$_{\_1}$ during the fabrication of the stacked device 1.

[1.2. Fabrication Method of Stacked Device 1]

A fabrication method of the stacked device 1 according to the present embodiment may include a forming step, a first stacking step, a test step, a removing step and a second stacking step. Note that, in the present embodiment, as an example, an assembly of a plurality of stacked devices 1 may be formed on a semiconductor substrate such as silicon by the forming step to the second stacking step, and the fabrication method of the stacked device may further include a shredding step of singulating each stacked device 1 included in the assembly.

[1.2-1. Forming Step]

Figure 2:
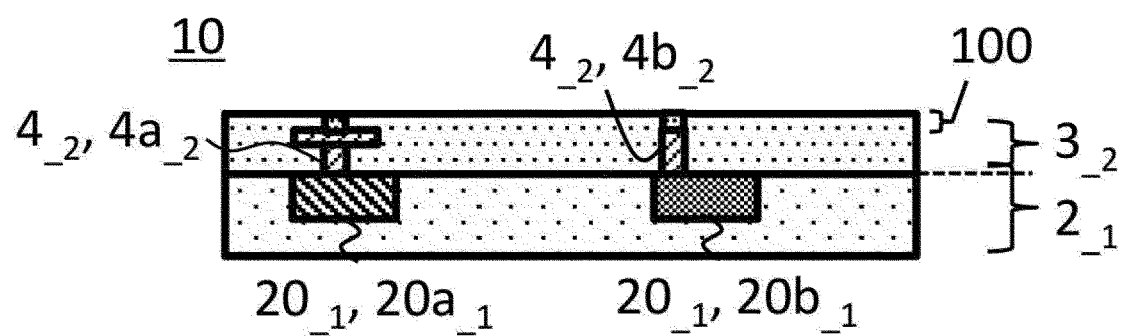
FIG. 2 describes a forming step.

FIG. 2 describes a forming step. In the forming step, a formed body 10 in which the stacked device 1 is formed up to a part of circuit layers 2 may be formed. In the present embodiment, as an example, an assembly of a plurality of formed bodies 10 may be collectively formed on a semiconductor substrate.

Each formed body 10 may have an insulating layer 3 on a surface thereof as long as the stacked device 1 has been formed up to the part of circuit layers 2. In the present embodiment, as an example, each formed body 10 may include a circuit layer 2$_{\_1}$ having a plurality of circuit portions 20a$_{\_1}$ and 20b$_{\_1}$, an insulating layer 3$_{\_2}$ configured to cover the plurality of circuit portions 20a$_{\_1}$ and 20b$_{\_1}$, and a plurality of conductive vias 4$_{\_2}$ electrically connected to the plurality of circuit portions 20a$_{\_1}$ and 20b$_{\_1}$ and exposed on a surface of the insulating layer 3$_{\_2}$.

Note that, the insulating layer 3$_{\_2}$ and the conductive via 4$_{\_2}$ of the formed body 10 formed in the forming step may be formed to be thicker than the insulating layer 3$_{\_2}$ and the conductive via 4$_{\_2}$ in the stacked device 1. A portion (also referred to as extra portion 100) on the surface-side of the insulating layer 3$_{\_2}$ and the conductive via 4$_{\_2}$ formed thicker than those in the stacked device 1 may be a portion that will be removed by over-polish in a removing step, which will be described later. The extra portion 100 of the conductive via $4_{\_2}$ may be formed of a material that is the same as or different from that of the other portion of the conductive via $4_{\_2}$.

The circuit layer 2 may be formed by providing a circuit element and a conductive path on the semiconductor substrate by a conventionally known method. In addition, the insulating layer 3 and the conductive via 4 may be formed by a conventionally known method. As an example, the insulating layer 3 may be formed by a CVD method.

[1.2-2. First Stacking Step]

Figure 3:
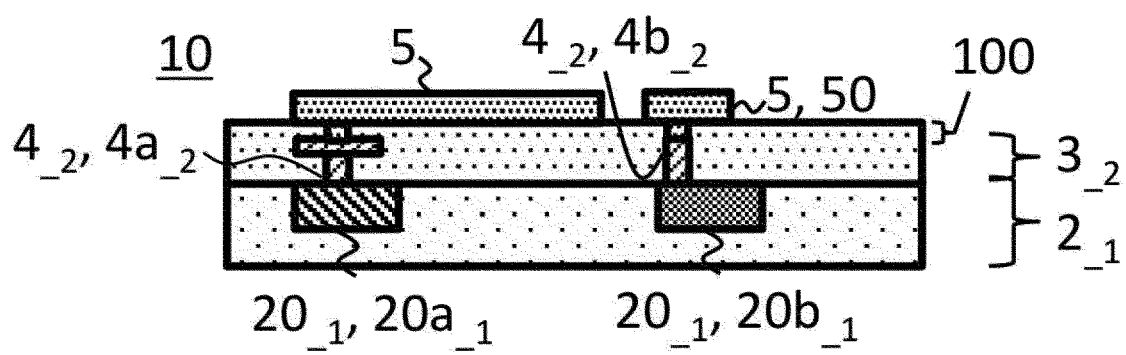
FIG. 3 describes a first stacking step.

FIG. 3 describes a first stacking step. In the first stacking step, a conductive path 5 electrically connected to the plurality of circuit portions 20 in the formed body 10 may be stacked on the formed body 10. In the present embodiment, as an example, a conductive path 5 electrically connected to the plurality of circuit portions $20_{\_1}$ via the plurality of conductive vias $4_{\_2}$ may be formed on a surface of the insulating layer $3_{\_2}$. In addition, a plurality of conductive paths 5 may be stacked at once on an assembly of a plurality of formed bodies 10. Note that, the conductive path 5 that is formed on each of the formed bodies 10 may also be one or plural. In a case where a plurality of conductive paths 5 are formed, each conductive path 5 may be electrically connected to the one or more circuit portions $20_{\_1}$.

The conductive path 5 that is formed may have a region in which current is caused to flow along the surface of the formed body 10, in other words, a region in which current is caused to flow in an in-plane direction of the surface of the formed body 10. In addition, the conductive path 5 may have an electrode pad 50 that is electrically connected to a probe 500 (refer to FIG. 4) that will be used in a test during the fabrication.

The stacking of the conductive path 5 may be performed by patterning. For example, the conductive path 5 may be stacked by forming an organic conductive film on the surface of the insulating layer $3_{\_2}$ and then performing a lithography method and an etching method. In addition, the stacking of the conductive paths 5 may be performed by inkjet printing or offset printing using conductive ink. When forming the electrode pad 50 on the conductive path 5, the electrode pad 50 may be formed by sputtering or vapor deposition by using aluminum or an Al—Si based alloy.

Note that, in the first stacking step, a heat dissipation structure (not shown) configured to dissipate heat from the plurality of circuit portions $20_{\_1}$ may be stacked on the formed body 10 together with the conductive path 5. The heat dissipation structure may be provided extending from a corresponding region of a position (also referred to as a hot spot), at which a temperature becomes high in the formed body 10 when a test is performed in the test step, of a surface of the insulating layer $3_{\_2}$ to an edge portion of the surface. The heat dissipation structure may be formed by imitating a heat dissipation path included in the stacked device 1 of a finished product. The heat dissipation structure may be formed of a material having high thermal conductivity (as an example, metal such as copper or aluminum).

[1.2-3. Test Step]

Figure 4:
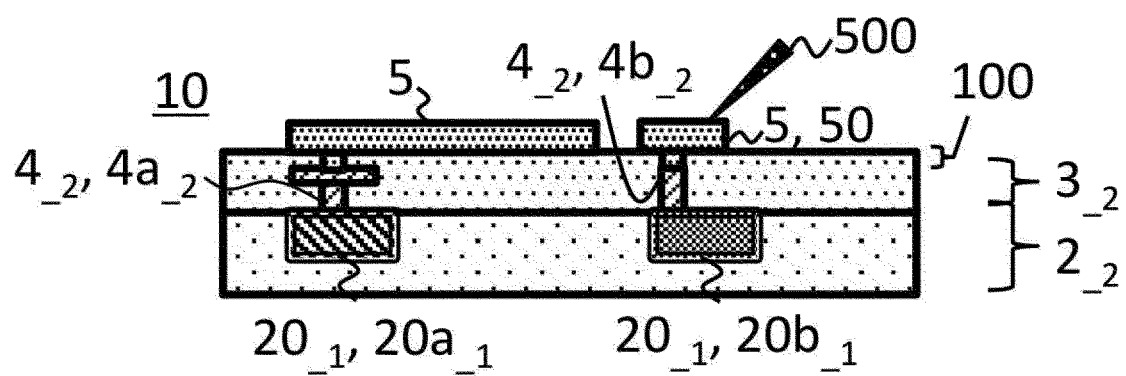
FIG. 4 describes a test step.

FIG. 4 describes a test step. In the test step, a test may be performed on at least a part of the plurality of circuit portions $20a_{\_1}$ by using the conductive path 5. In the present embodiment, as an example, a test may be performed by bringing the probe 500 of a test apparatus (not shown) into contact with the electrode pad 50 of the conductive path 5 and causing an electric signal to flow from the probe 500 to the circuit portion 20 or a test may be performed on the circuit portion $20a_{\_1}$ by using the circuit portion $20b_{\_1}$. Note that, in the present drawing, the circuit portion 20 in a conductive state is shown with a double frame line.

In the present embodiment, as an example, a test may be performed on each circuit portion $20a_{\_1}$ of the plurality of formed bodies 10 included in the assembly. For an assembly where a ratio or quantity of the formed bodies 10 having favorable test results was equal to or higher than a reference among the formed bodies 10 included in the assembly, the next removing step and the steps thereafter may be performed to fabricate the stacked device 1. An assembly where a ratio or quantity of the formed bodies 10 having poor test results was less than the reference among the formed bodies 10 included in the assembly may be discarded.

[1.2-4. Removing Step]

Figure 5:
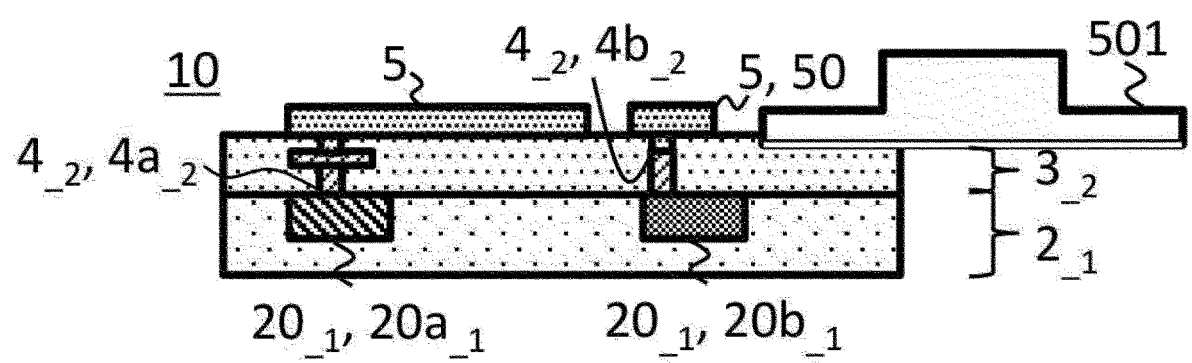
FIG. 5 describes a removing step.

FIG. 5 describes a removing step. In the removing step, the conductive path 5 may be broken and removed. When the heat dissipation structure is formed in the first stacking step, the heat dissipation structure may be further removed in the removing step. The conductive path 5 and the heat dissipation structure may be removed by polishing (as an example, CMP: Chemical Mechanical Polishing), etching and cleaning. As long as the conductive path 5 is broken and removed, the insulating layer $3_{\_2}$ below the conductive path 5 and at least a part (in the present embodiment, the extra portion 100 described above) of the conductive via $4_{\_2}$ formed in the insulating layer $3_{\_2}$ may be further broken and removed, and as an example, over-polish of performing excessive polishing may be performed. Note that, in the present drawing, as an example, a state in which the formed body 10 is over-polished by a polishing pad 501 is shown.

Figure 6:
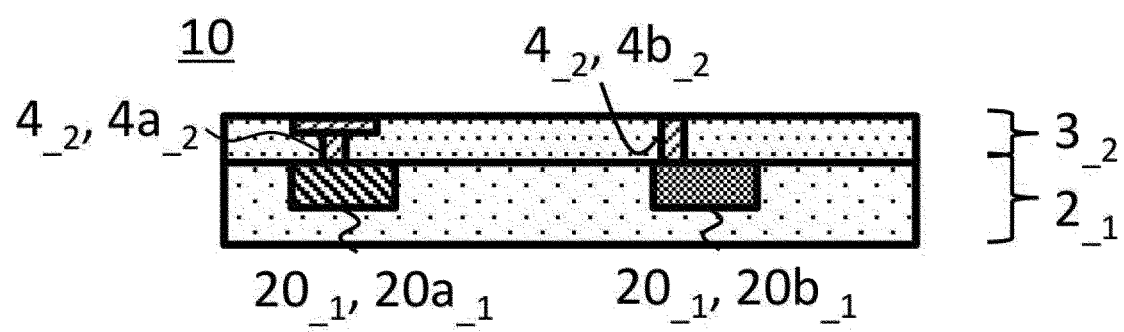
FIG. 6 shows a formed body 10 after the removing step has been performed.

FIG. 6 shows the formed body 10 after the removing step has been performed. In the formed body 10 after the removing step, the extra portion 100 of the insulating layer $3_{\_2}$ and the conductive via $4_{\_2}$ formed in the forming step may be removed.

[1.2-5. Second Stacking Step]

Figure 7:
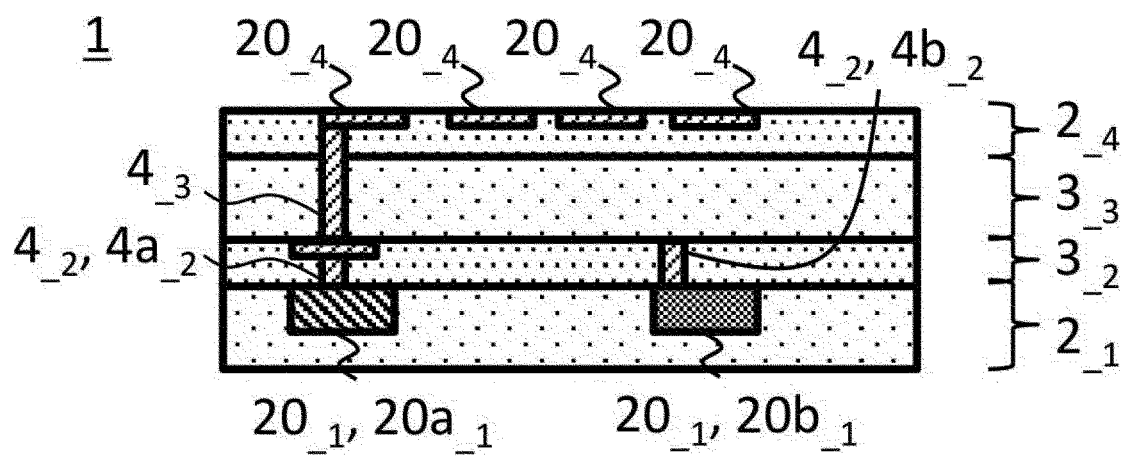
FIG. 7 describes a second stacking step.

FIG. 7 describes a second stacking step. In the second stacking step, at least one other circuit layer 2 may be stacked on the formed body 10. In the present embodiment, as an example, the insulating layer $3_{\_2}$ and the circuit layer $2_{\_4}$ may be stacked on the formed body 10. The stacking of the other circuit layer 2 may be performed by bonding a substrate (as an example, a PCB: Printed Circuit Board) having one or more circuit layers 2 to the formed body 10. If the end surface of each conductive via $4_{\_2}$ is exposed by the removing step, the one or more conductive vias $4_{\_2}$ may be electrically connected to the circuit portion $20_{\_4}$ of the circuit layer $2_{\_4}$. Thereby, an assembly of the stacked device 1 may be formed.

[1.2-6. Shredding Step]

In the shredding step, the assembly of the stacked device 1 formed on the semiconductor substrate may be shredded to singulate each stacked device 1. As an example, the semiconductor substrate may be cut along a preset scribe line. Thereby, the stacked device 1 of a finished product is fabricated.

According to the above fabrication method, the conductive path 5 electrically connected to the circuit portion $20_{\_1}$ included in the formed body 10 having the circuit layer $2_{\_1}$ formed therein is stacked on the formed body 10 and the test is performed on the circuit portion $20a_{\_1}$. Therefore, it is possible to determine a quality of the stacked device 1 during the fabrication. In addition, since the conductive path 5 is broken and removed after the test, it is possible to prevent the conductive path 5 for the test from being left in the stacked device 1 of the finished product and increasing a size of the stacked device 1. Further, it is possible to prevent a trace of the test (as an example, a probe trace formed on the conductive path 5 and particles generated from the electrode pad 50 and the like by probing) from being left in the stacked device 1 of the finished product and adversely affecting a quality.

In addition, since the plurality of circuit portions 20 of the formed body 10 includes the circuit portion $20a_{\_1}$, which constitutes a circuit of the stacked device 1, and the circuit portion $20b_{\_1}$, which is used for a test of the circuit portion $20a_{\_1}$, it is possible to perform the test of the circuit portion $20a_{\_1}$ by using the circuit portion $20b_{\_1}$.

Further, in the first stacking step, since the conductive path 5 electrically connected to the plurality of circuit portions $20_{\_1}$ via the plurality of conductive vias 4 is formed on the surface of the insulating layer $3_{\_2}$, it is possible to prevent an unintended circuit portion $20_{\_1}$ and the conductive path 5 from being electrically connected to each other and to facilitate the formation of the conductive path 5.

Further, since the conductive path 5 has a region in which the current is caused to flow along the surface of the formed body 10, the circuit portions 20 in the formed body 10 can be easily connected to each other to perform a test.

Further, since the conductive path 5 has the electrode pad 50 that is electrically connected to the probe 500, the probe 500 can be brought into contact with the electrode pad 50 to perform a test.

Further, in the first stacking step, since the heat dissipation structure that dissipates heat from the plurality of circuit portions 20 is stacked on the formed body 10 together with the conductive path 5, the test can be performed while dissipating heat from the circuit portions 20. Further, the heat dissipation structure is formed by imitating the stacked device 1 of the finished product, so that the test can be performed in a state where the formed body 10 is put into a similar heat dissipation state to the stacked device 1 of the finished product. In addition, since the heat dissipation structure is removed in the removing step, it is possible to prevent the heat dissipation structure temporarily provided for a test from being left in the stacked device 1 of the finished product and increasing the size of the stacked device 1.

Further, after the conductive path 5 is broken and removed, the circuit layer $2_{\_4}$ is stacked on the formed body 10. Therefore, it is possible to complete the stacked device 1 by forming the circuit layer $2_{\_4}$.

Note that, in the first embodiment, it has been described that the circuit portion $20a_{\_1}$ in the circuit layer $2_{\_1}$ is tested by the circuit portion $20b_{\_1}$ in the circuit layer $2_{\_1}$. However, in addition to or instead of the circuit portion $20a_{\_1}$ in the circuit layer $2_{\_1}$, the circuit portion 20 in another circuit layer 2 formed already may also be tested.

2. Second Embodiment

[2.1 Stacked Device]

Figure 8:
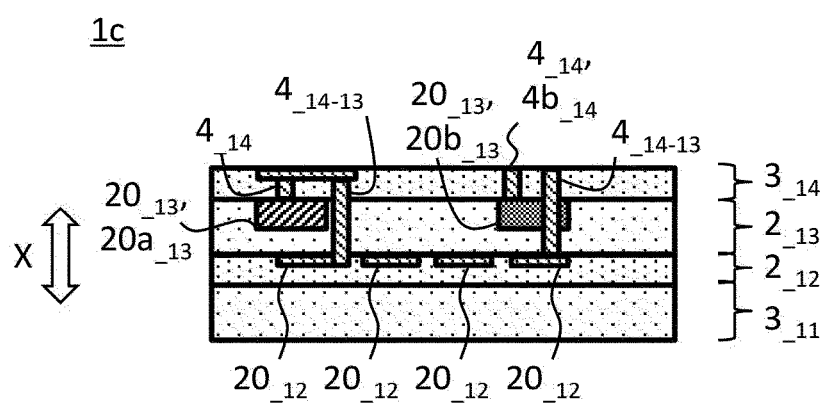
FIG. 8 shows a stacked device 1c according to a second embodiment.

FIG. 8 shows a stacked device $1c$ according to the present embodiment. Note that, in the stacked device $1c$ according to the present embodiment, the same reference numerals are given to those having substantially the same configurations as the stacked device 1 shown in FIG. 1, and the description thereof is omitted.

The stacked device $1c$ includes a plurality of circuit layers 2 (two circuit layers $2_{\_12}$ and $2_{\_13}$, as an example, in the present embodiment), a plurality of insulating layers 3 (two insulating layers $3_{\_11}$ and $3_{\_14}$, as an example, in the present embodiment), and a plurality of conductive vias 4. The stacked device $1c$ may have the insulating layer $3_{\_11}$, the circuit layer $2_{\_12}$, the circuit layer $2_{\_13}$, and the insulating layer $3_{\_14}$ in order from the lower layer-side.

[2.1-1. Circuit Layers $2_{\_12}$ and $2_{\_13}$]

The circuit layer $2_{\_12}$ has a plurality of circuit portions $20_{\_12}$, and the circuit layer $2_{\_13}$ has a plurality of circuit portions $20_{\_13}$. Each circuit portion $20_{\_12}$ provided in the circuit layer $2_{\_12}$ may constitute a circuit of the stacked device $1c$. A part of circuit portions $20_{\_13}$ (also referred to as circuit portion $20a_{\_13}$) of the plurality of circuit portions $20_{\_13}$ provided in the circuit layer $2_{\_13}$ may be an example of the first circuit portion, and may constitute the circuit of the stacked device $1c$.

In addition, another circuit portion $20_{\_13}$ (also referred to as circuit portion $20b_{\_13}$), which is different from the circuit portion $20a_{\_13}$, of the plurality of circuit portions $20_{\_13}$ may be an example of the second circuit portion, and may not constitute the circuit of the stacked device $1c$. The circuit portion $20b_{\_13}$ may not be electrically connected to the circuit portion $20a_{\_13}$ in the circuit layer $2_{\_13}$. Similar to the circuit portion $20b_{\_1}$ in the first embodiment described above, the circuit portion $20b_{\_13}$ may be a portion used in a test of the circuit portion $20a_{\_13}$ during the fabrication of the stacked device $1c$.

However, unlike the circuit portion $20b_{\_1}$, the circuit portion $20b_{\_13}$ may be broken during the fabrication of the stacked device $1c$. For example, the circuit portion $20b_{\_13}$ may be a wreckage as a result of breaking at least partially any of an ESD protection circuit, a BIST circuit, a process monitor circuit, and a switching circuit along the stacking direction X. The circuit portion $20b_{\_13}$ may be formed using material generally applicable in semiconductor device manufacturing (as an example, Si, $SiO_2$, SiN, and the like), a dopant (B, P, As, and the like), an insulator, and a conductive material (as an example, W, Ti, Mo, Ru, Ta, Cu, and the like).

[2.1-2. Insulating Layers $3_{\_11}$ and $3_{\_14}$]

The insulating layer $3_{\_11}$ is provided adjacent to a lower surface of the circuit layer $2_{\_12}$, and the insulating layer $3_{\_14}$ is provided adjacent to an upper surface of the circuit layer $2_{\_13}$. The insulating layer $3_{\_14}$ may be configured to cover the plurality of circuit portions $20_{\_13}$ included in the circuit layer $2_{\_13}$.

[2.1-3. Conductive Via 4]

One or more conductive vias 4 (also referred to as conductive vias $4_{\_14}$), which are provided in the insulating layer $3_{\_14}$, of the plurality of conductive vias 4 may be electrically connected to the plurality of circuit portions $20_{\_13}$ included in the circuit layer $2_{\_13}$. The conductive via $4_{\_14}$ (also referred to as conductive via $4b_{\_14}$), which is electrically connected to the circuit portion $20b_{\_13}$, of the plurality of conductive vias $4_{\_14}$ may be electrically insulated on an end surface (an upper end surface, in the present embodiment) on an opposite side to the circuit portion $20b_{\_13}$. In the present embodiment, as an example, the end surface of the conductive via $4b_{\_14}$ may be covered by an insulating film (not shown). Thereby, the circuit portion $20b_{\_13}$ may be embedded in the stacked device $1c$ and may be in a state of being electrically separated from the other circuit portions 20.

In addition, one or more other conductive vias 4 (also referred to as conductive vias $4_{\_14\text{-}13}$), which are provided in the insulating layer $3_{\_14}$, of the plurality of conductive vias 4 may be provided penetrating through the circuit layer $2_{\_13}$ and may be electrically connected to the plurality of circuit portions $20_{\_12}$ included in the circuit layer $2_{\_12}$. At least one conductive via $4_{\_14\text{-}13}$ may penetrate through the circuit layer $2_{\_13}$ at a position of the circuit portion $20b_{\_13}$. Thereby, the circuit portion $20b\_{13}$ may be broken at least partially along the stacking direction X. The description 'broken along the stacking direction X' may mean having a broken surface extending in the stacking direction X (in the present embodiment, as an example, an inner peripheral surface of the conductive via $4\_{14\text{-}13}$), or may mean being cut in the stacking direction X. The one or more conductive vias $4\_{14}$ and the one or more conductive vias $4\_{14\text{-}13}$ may be electrically connected to each other on the surface or the like of the insulating layer $3\_{14}$.

According to the above stacked device 1, the circuit portion $20b\_{13}$ is broken at least partially along the stacking direction X. Therefore, when performing a test of another circuit portion $20a\_{13}$ by using the circuit portion $20b\_{13}$ for a test during the fabrication, it is possible to securely prevent the circuit portion $20b\_{13}$ for a test from being conducted to become an unnecessary capacitive component in the stacked device $1c$ of the finished product, thereby improving the quality of the stacked device $1c$. In addition, since the forming position of the circuit portion $20b\_{13}$ for a test can be used as a forming position of the conductive via 4, the stacked device $1c$ can be miniaturized.

[2.2. Fabrication Method of Stacked Device $1c$]

The stacked device $1c$ of the present embodiment can be fabricated by a first forming step, a first stacking step, a test step, a removing step, a second forming step, a second stacking step and a shredding step. The first forming step to the removing step may be performed in a similar manner to the forming step to the removing step in the first embodiment.

Figure 9:
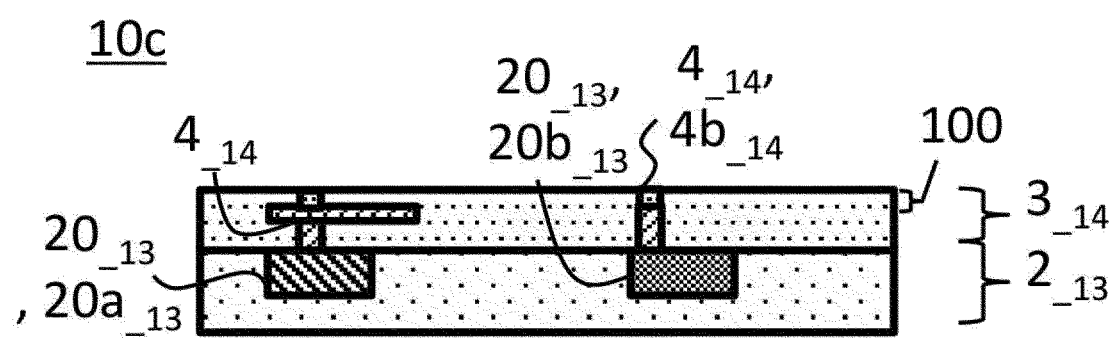
FIG. 9 shows a formed body 10c after a first forming step.
Figure 10:
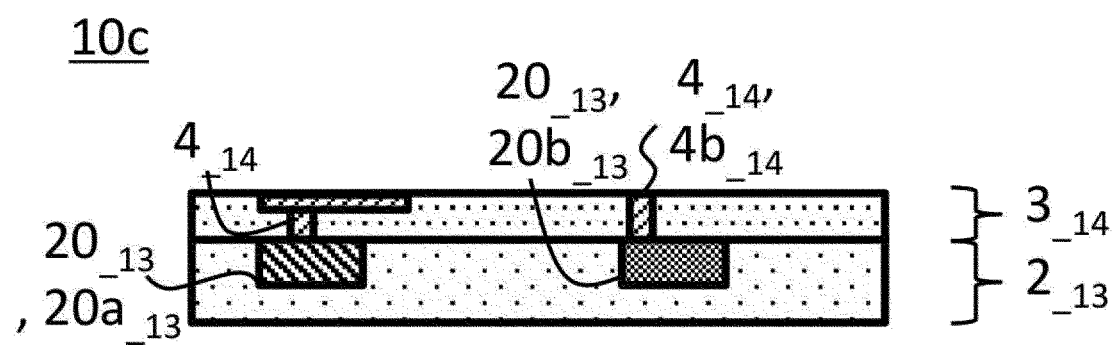
FIG. 10 shows the formed body 10c after a removing step.

FIG. 9 shows a formed body $10c$ after the first forming step. FIG. 10 shows the formed body $10c$ after the removing step. The formed body $10c$ of the present embodiment may have the insulating layer $3\_{14}$ and the circuit layer $2\_{13}$. The conductive via $4b\_{14}$ provided in the insulating layer $3\_{14}$ may not be insulated on the upper end surface after the forming step or the removing step.

In the second forming step, a through-hole penetrating through the circuit portion $20b\_{13}$ for a test may be provided in the insulating layer $3\_{13}$, an inner peripheral surface of the through-hole may be insulated, and then the conductive via $4\_{14\text{-}13}$ may be provided in the through-hole. Thereby, at least a part of the circuit portion $20b\_{13}$ is broken along the stacking direction X of the stacked device $1c$.

Figure 11:
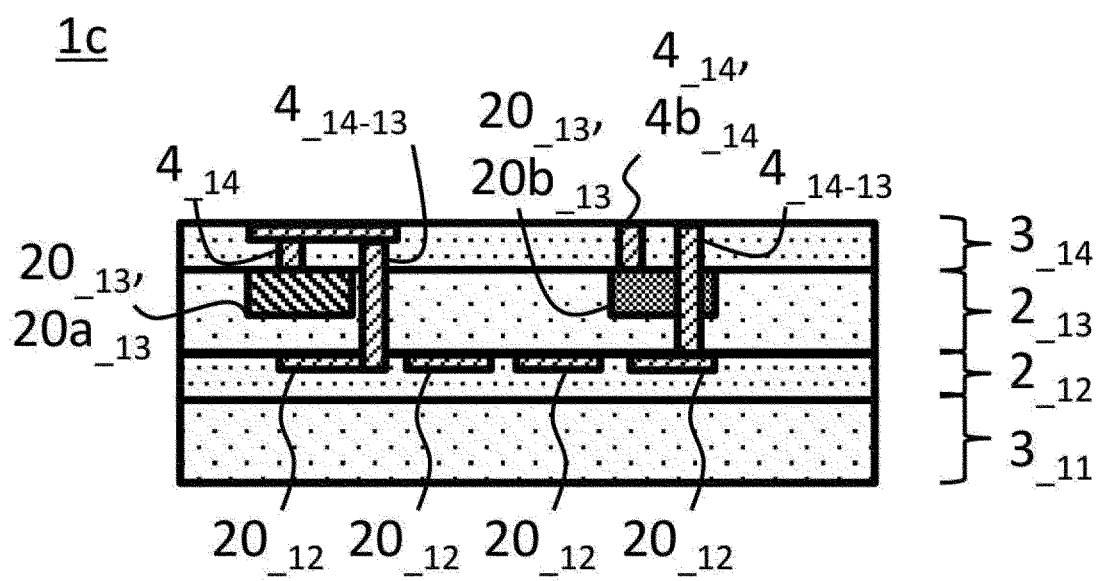
FIG. 11 describes a second stacking step.

FIG. 11 describes a second stacking step. In the second stacking step, at least one other circuit layer 2 may be stacked on the formed body $10c$ in a similar manner to the first embodiment. In the present embodiment, as an example, the circuit layer $2\_{12}$ may be stacked on the lower surface of the formed body $10c$, i.e., the lower surface of the circuit layer $2\_{13}$, and each conductive via $4\_{14\text{-}13}$ exposed on the lower surface of the circuit layer $2\_{13}$ may be electrically connected to the circuit portion $20\_{12}$ of the circuit layer $2\_{12}$. Thereby, an assembly of the stacked device $1c$ may be formed. Note that, in the second stacking step, the conductive via $4b\_{14}$ provided in the insulating layer $3\_{14}$ may be insulated on the upper end surface.

In the shredding step, the assembly of the stacked device $1c$ formed on the semiconductor substrate may be shredded to singulate each stacked device $1c$, in a similar manner to the first embodiment described above. Thereby, the stacked device $1c$ of a finished product is fabricated.

According to the above fabrication method, at least a part of the circuit portion $20b\_{13}$ is broken along the stacking direction X of the stacked device $1c$ after the test. Therefore, it is possible to form the conductive via $4\_{14\text{-}13}$ by using a position of the circuit portion $20b\_{13}$ used in the test. Therefore, it is possible to prevent the stacked device $1c$ from being large in size due to the circuit portion $20b\_{13}$ for a test provided during the fabrication.

Note that, in the second embodiment, the circuit portion $20b\_{13}$ has been described as being broken at least partially by the second forming step of forming the conductive via $4\_{14\text{-}13}$, but may also be broken by the shredding step of singulating the assembly of the stacked device $1c$. In this case, the conductive via $4\_{14\text{-}13}$ may be formed in advance on the scribe line of the stacked device $1c$.

3. Third Embodiment

[3.1 Stacked Device]

Figure 12:
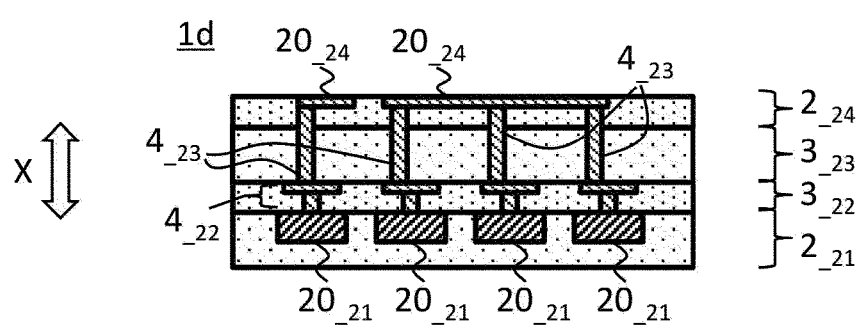
FIG. 12 shows a stacked device 1d according to a third embodiment.

FIG. 12 shows a stacked device $1d$ according to the present embodiment. Note that, in the stacked device $1d$ according to the present embodiment, the same reference numerals are given to those having substantially the same configurations as the stacked devices 1 and $1c$ shown in FIGS. 1 and 8, and the description thereof is omitted.

The stacked device $1d$ includes a plurality of circuit layers 2 (two circuit layers $2\_{21}$ and $2\_{24}$, as an example, in the present embodiment), a plurality of insulating layers 3 (two insulating layers $3\_{22}$ and $3\_{23}$, as an example, in the present embodiment), and a plurality of conductive vias 4. The stacked device $1d$ may have the circuit layer $2\_{21}$, the insulating layer $3\_{22}$, the insulating layer $3\_{23}$ and the circuit layer $2\_{24}$ in order from the lower layer-side.

[3.1-1. Circuit Layers $2\_{21}$ and $2\_{24}$]

The circuit layer $2\_{21}$ has a plurality of circuit portions $20\_{21}$, and the circuit layer $2\_{24}$ has a plurality of circuit portions $20\_{24}$. Each of the circuit portions $20\_{21}$ and $22\_{24}$ may constitute a circuit of the stacked device $1d$.

[3.1-2. Insulating Layers $3\_{22}$ and $3\_{23}$]

The insulating layer $3\_{22}$ is provided adjacent to an upper surface of the circuit layer $2\_{21}$, and the insulating layer $3\_{23}$ is provided adjacent to a lower surface of the circuit layer $2\_{24}$. The insulating layer $3\_{22}$ may be configured to cover the plurality of circuit portions $20\_{21}$ included in the circuit layer $2\_{21}$.

[3.1-3. Conductive Via 4]

A conductive via 4 (also referred to as conductive via $4\_{22}$), which is provided in the insulating layer $3\_{22}$, of the plurality of conductive vias 4 may be electrically connected to the plurality of circuit portions $20\_{21}$ included in the circuit layer $2\_{21}$. A conductive via 4 (also referred to as conductive via $4\_{23}$), which is provided in the insulating layer $3\_{23}$, of the plurality of conductive vias 4 may be electrically connected to the plurality of circuit portions $20\_{24}$ included in the circuit layer $2\_{24}$. The conductive via $4\_{22}$ and the conductive via $4\_{23}$ may be electrically connected to each other on a one-to-one basis. Thereby, any circuit portion $20\_{21}$ of the circuit layer $2\_{21}$ and any circuit portion $20\_{24}$ of the circuit layer $2\_{24}$ are electrically connected to each other.

[3.2. Fabrication Method of Stacked Device $1d$]

The stacked device $1d$ of the present embodiment can be fabricated by a forming step, a first stacking step, a test step, a removing step, a second stacking step and a shredding step.

[3.2-1. Forming Step]

Figure 13:
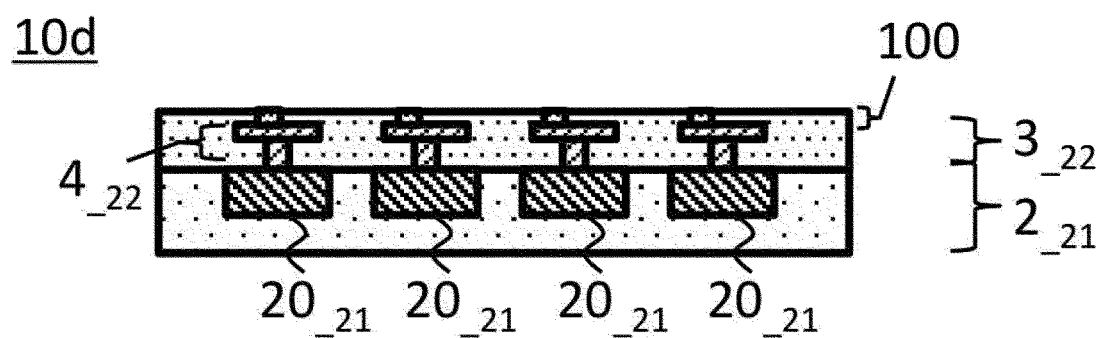
FIG. 13 describes a forming step.

FIG. 13 describes a forming step. In the forming step of the present embodiment, a formed body $10d$ in which the stacked device $1d$ is formed up to a part of circuit layers 2 may be formed in a similar manner to the first embodiment described above. The formed body $10d$ may include a circuit layer $2\_{21}$ having a plurality of circuit portions $20\_{21}$, an insulating layer $3\_{22}$ configured to cover the plurality of circuit portions $20\_{21}$, and a plurality of conductive vias $4\_{22}$ electrically connected to the plurality of circuit portions $20\_{21}$ and exposed on a surface of the insulating layer $3\_{22}$.

[3.2-2. First Stacking Step]

Figure 14:
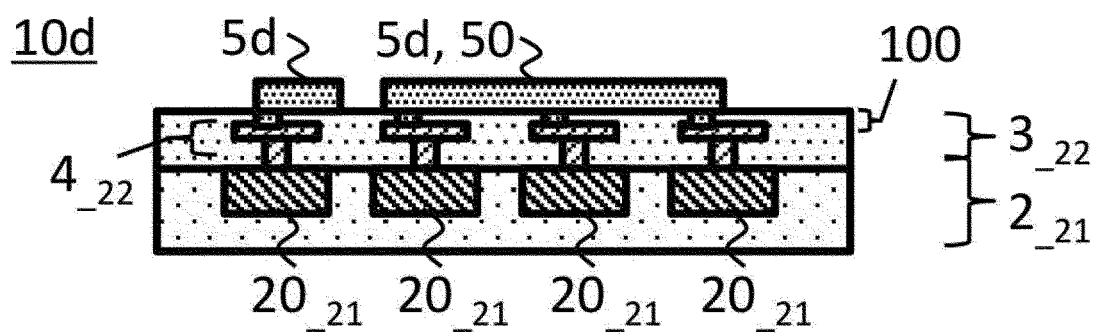
FIG. 14 describes a first stacking step.

FIG. 14 describes a first stacking step. In the first stacking step of the present embodiment, a conductive path $5d$ electrically connected to the plurality of circuit portions $20\_{21}$ in the formed body $10d$ may be stacked on the formed body $10d$ in a similar manner to the first embodiment described above. The conductive path $5d$ may have at least a part of a conductive path, which is not included in the formed body $10d$, of a conductive path formed in the stacked device $1d$ of a finished product. The conductive path $5d$ may be a conductive path that imitates at least a part of the plurality of circuit portions $20\_{24}$ in the circuit layer $2\_{24}$.

In the first stacking step of the present embodiment, a heat dissipation structure (not shown) configured to dissipate heat from the plurality of circuit portions $20\_{21}$ may be formed on the formed body $10d$ together with the conductive path $5d$ in a similar manner to the first embodiment described above.

[3.2-3. Test Step]

Figure 15:
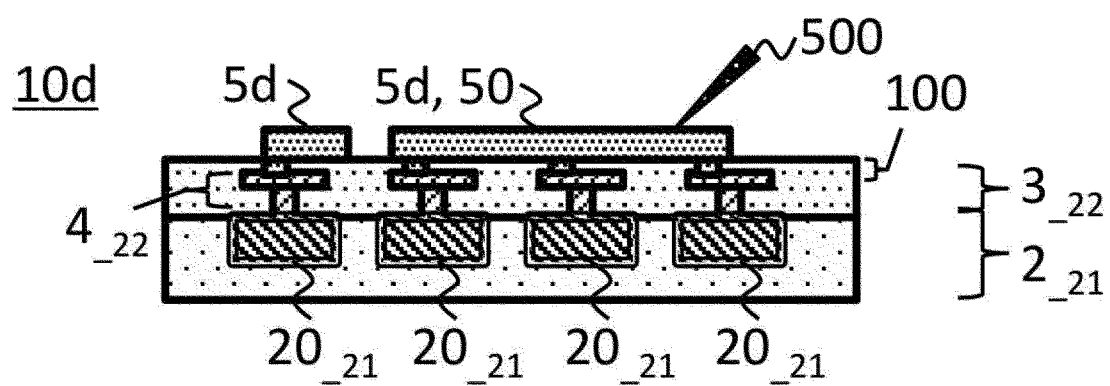
FIG. 15 describes a test step.

FIG. 15 describes a test step. In the test step of the present embodiment, a test may be performed on at least a part of the plurality of circuit portions $20\_{21}$ by using the conductive path $5d$, in a similar manner to the first embodiment described above. In the present embodiment, as an example, a test may be performed on each of the plurality of circuit portions $20\_{21}$.

[3.2-4. Removing Step]

Figure 16:
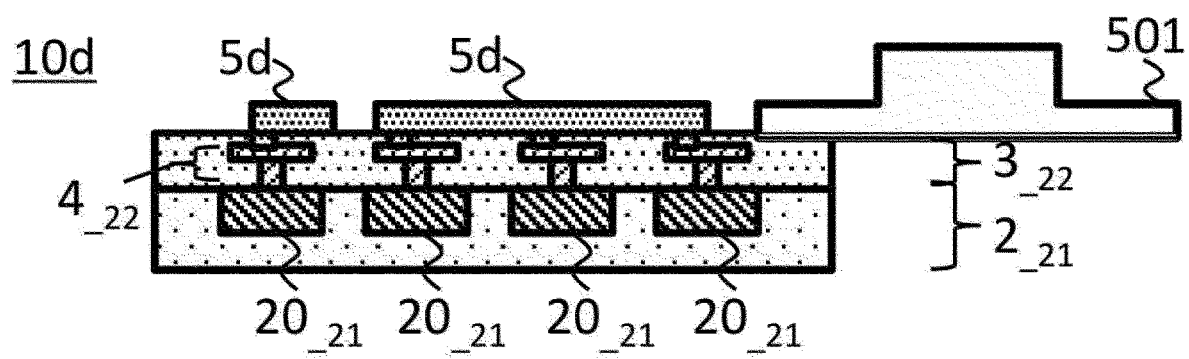
FIG. 16 describes a removing step.

FIG. 16 describes a removing step. In the removing step of the present embodiment, the conductive path $5d$ may be broken and removed, in a similar manner to the first embodiment described above.

Figure 17:
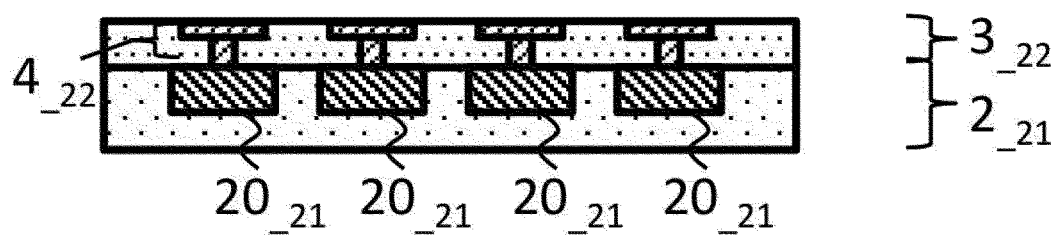
FIG. 17 shows a formed body 10d after the removing step has been performed.

FIG. 17 shows the formed body $10d$ after the removing step has been performed. In the formed body $10d$ after the removing step, the extra portion $100$ on a surface-side (upper surface-side, in the drawing) of the insulating layer $3\_{22}$ and the conductive via $4\_{22}$ formed in the forming step may be removed.

[3.2-5. Second Stacking Step]

Figure 18:
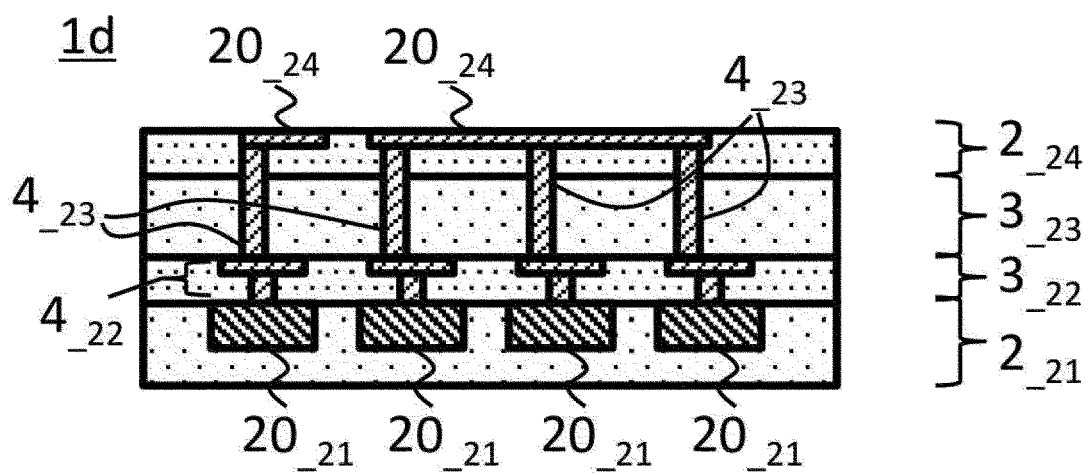
FIG. 18 describes a second stacking step.

FIG. 18 describes a second stacking step. In the second stacking step of the present embodiment, at least one other circuit layer 2 may be stacked on the formed body $10d$ in a similar manner to the first embodiment described above. In the present embodiment, as an example, the insulating layer $3\_{23}$ and the circuit layer $2\_{24}$ may be stacked on the formed body $10d$. Thereby, an assembly of the stacked device $1d$ may be formed.

3.2-6. Shredding Step]

In the shredding step, the assembly of the stacked device $1d$ formed on the semiconductor substrate may be shredded to singulate each stacked device $1d$, in a similar manner to the first embodiment described above. Thereby, the stacked device $1d$ of a finished product is fabricated.

According to the above fabrication method, the conductive path $5d$ has at least a part of the conductive path, which is not included in the formed body $10d$, of the conductive path formed in the stacked device $1d$ by the circuit portion 20. Therefore, the circuit portion $20\_{21}$ in the formed body $10d$ can be tested in a similar electrical connection state to an inside of the stacked device $1d$ of the finished product. In other words, it is possible to perform a test while imitating the electrical connection state of the stacked device $1d$ of the finished product.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

1: stacked device
2: circuit layer
3: insulating layer
4: conductive via
5: conductive path
10: formed body
20: circuit portion
50: electrode pad
500: probe

What is claimed is:

1. A stacked device comprising:
a plurality of circuit layers each having one or more circuit portions, the plurality of circuit layers including at least one circuit layer having a plurality of circuit portions, the plurality of circuit portions of the at least one circuit layer including a disconnected circuit portion;
an insulating layer configured to cover the plurality of circuit portions of the at least one circuit layer; and
a plurality of conductive vias provided in the insulating layer and electrically connected to the plurality of circuit portions of the at least one circuit layer, at least one of the plurality of conductive vias being electrically connected to the disconnected circuit portion, wherein
any of the plurality of conductive vias electrically connected to the disconnected circuit portion is electrically insulated on an end surface on an opposite side to the plurality of circuit portions of the at least one circuit layer such that the disconnected circuit portion is not electrically connected to any other of the one or more circuit portions on any of the plurality of circuit layers.

2. The stacked device according to claim 1, wherein the disconnected circuit portion is broken at least partially along a stacking direction.

3. The stacked device according to claim 1, wherein the disconnected circuit portion has at least one of an ESD protection circuit, a BIST circuit, a process monitor circuit, a switching circuit configured to switch a connection destination, or a wreckage as a result of breaking at least partially any one of these circuits along a stacking direction.

4. The stacked device according to claim 1, wherein the one or more circuit portions of the plurality of circuit layers each include at least one element selected from a resistor, a coil, a capacitor, a transistor, and a diode.

* * * * *